United States Patent [19]

Selim

[11] Patent Number: 4,654,886
[45] Date of Patent: Mar. 31, 1987

[54] LOCAL OSCILLATOR NULL CIRCUIT AND METHOD
[75] Inventor: Harold N. Selim, Wichita, Kans.
[73] Assignee: IFR, Inc., Wichita, Kans.
[21] Appl. No.: 727,268
[22] Filed: Apr. 25, 1985
[51] Int. Cl.[4] .......................... H04B 1/26; H04B 1/10
[52] U.S. Cl. .................................... 455/317; 455/319; 455/325
[58] Field of Search .............................. 455/317–319, 455/323, 325, 326, 327, 302; 333/160, 161, 81 A; 329/174

[56] References Cited

U.S. PATENT DOCUMENTS 3,781,722  12/1973  Pierson ................................. 333/160
4,325,023   4/1982  Zirwick .
4,355,420  10/1982  Ishihara ................................ 455/317
4,451,782   5/1984  Ashida .

FOREIGN PATENT DOCUMENTS 144554  11/1980  Japan .
11506    1/1982  Japan ................................... 455/317
25432    2/1984  Japan ................................... 455/317

Primary Examiner—Jin F. Ng
Attorney, Agent, or Firm—Woodard, Weikart, Emhardt & Naughton

[57]  ABSTRACT

A local oscillator null circuit and method for use in tuning a wideband, heterodyne receiver relatively close to zero frequency without experiencing excessive feedthrough from a local oscillator to an associated IF stage in the receiver. The local oscillator is connected to circuit means for generating a derivative signal proportional to the local oscillator signal and shifted in phase with respect thereto by a desired amount determined by the phase difference between the local oscillator signal and the signal in the mixer output spectrum which is at the local oscillator frequency. The null circuit combines the derivative signal with the mixer output signal proportionally to produce a null at the local oscillator frequency.

17 Claims, 6 Drawing Figures

LOCAL OSCILLATOR NULL CIRCUIT AND METHOD

BACKGROUND OF THE INVENTION

This invention relates to heterodyne receivers and, particularly, to wideband, heterodyne receivers which tune relatively close to zero frequency.

Heterodyne receivers capable of tuning from very low frequencies to much higher frequencies are widely used in communications equipment as well as test and instrumentation equipment such as network and signal analyzers. The band of interest in frequency domain analysis of amplifiers, filters, mixers and many other types of linear and nonlinear networks and systems, as well as in analysis of mechanical vibration, often includes frequency components which are many orders of magnitude apart, sometimes as widely separated as sub-audible and microwave frequencies. Tuning over such wide bands of interest, whether discrete or swept, presents difficulties not encountered in other tuning situations.

Conventional heterodyne receivers include an RF amplifier and a local oscillator coupled to respective inputs of a mixer which in turn is connected to an IF stage. Such receivers are tuned to a desired input signal frequency by setting the local oscillator frequency above or below the first IF frequency by the amount of the desired input frequency such that the difference or sum frequency component produced by the mixer is at the IF frequency. Whether the sum of difference frequency component from the mixer is desired, for tuning close to zero frequency such conventional systems require that the local oscillator be set to a frequency which is close to the IF frequency. Since a mixer produces a number of frequency components including both the signal and local oscillator frequencies as well as the sum and difference thereof, when a conventional receiver is tuned close to zero frequency, a signal at the local oscillator frequency passes through the IF stage to the detector where it cannot be discriminated from the IF signal itself. Moreover, if the amplitude of the local oscillator signal passing through the mixer is excessively high, the IF circuits may saturate as a result of the unwanted signal, causing spurious signals and loss of gain.

One way to reduce the feedthrough problem just described is to use a first IF filter with a very narrow passband. Precision parts are required for high-Q filters, and the cost of such filters is accordingly high. Also, the bandwidth of the filter may be required to be wider for other reasons, such as ease of signal detection during coarse tuning.

An alternative approach is to avoid the problem by switching both the local oscillator (L.O.) and first IF frequencies to much lower frequencies when tuning close to zero frequency. For example, in a system where the first IF frequency is fixed at 100 MHz, when the system is tuned to receive a signal close to zero frequency, e.g., 100 KHz, the L.O. would have to be tuned to 100.1 MHz to tune in the 100 KHz signal, and the feedthrough at 100.1 MHz would be well within the passband of the 100 MHz IF amp. Instead, the IF frequency might be switched down to 1 MHz and the L.O. switched down in frequency accordingly. The L.O. would then be tuned to 1.1 MHz to receive the 100 KHz signal, proportionally farther away from the first IF frequency of 1 MHz than 100.1 MHz is from 100.0 MHz. With this approach, the L.O. frequency feedthrough can be adequately suppressed in a conventional IF filter. However, additional circuitry including switching circuitry is necessary with this approach.

SUMMARY OF THE INVENTION

The present invention provides a local oscillator null circuit for a heterodyne receiver in which the mixer produces an output spectrum which includes the local oscillator frequency in addition to the frequency of an associated tuned IF stage. According to the invention, the local oscillator is connected to circuit means for generating a derivative signal proportional to the local oscillator signal and shifted in phase with respect thereto by a desired amount determined by the phase difference between the local oscillator signal and the signal in the mixer output spectrum which is at the local oscillator frequency. The null circuit includes means for combining the derivative signal with the mixer output signal proportionally to produce a null at the local oscillator frequency, the combining means being connected between the mixer and the IF stage.

According to another aspect of the invention, a method is provided for reducing the effect of feedthrough from a local oscillator to an associated IF stage in a heterodyne receiver, the method comprising summing the mixer output signal with a signal derived from the local oscillator signal and having substantially the same amplitude as and opposite phase of the signal at the local oscillator frequency in the mixer output spectrum.

A further aspect of the invention involves a method of tuning relatively close to zero frequency with a wideband, heterodyne receiver without experiencing excessive local oscillator feedthrough. The method steps include tuning the local oscillator to a frequency corresponding to the RF input signal, mixing the local oscillator signal and the RF input signal in the mixer, deriving a signal from the local oscillator signal which is opposite in phase to the signal in the mixer output spectrum which is at the local oscillator frequency, and summing the derivative signal and the mixer output signal in a proportion such that the derivative signal cancels the signal in the mixer output spectrum which is at the local oscillator frequency.

A general object of the present invention is to provide an improved system and method for tuning a heterodyne receiver relatively close to zero frequency.

Another object is to reduce the effects of local oscillator feedthrough, such as spurious signals and loss of gain, resulting from tuning a heterodyne receiver relatively close to zero frequency.

A further object of the invention is to enable tuning a heterodyne receiver over a frequency band several decades wide and having a lower frequency limit relatively close to zero frequency without changing the IF frequency.

Another object is to enable accurate signal detection in a heterodyne receiver tuned to a frequency at which the local oscillator frequency is in the passband of the IF filter.

These and other objects and advantages of the present invention will become more apparent upon reference to the following detailed description and accompanying drawings.

DESCRIPTION OF THE PREFERRED EMBODIMENT

Figure 1:
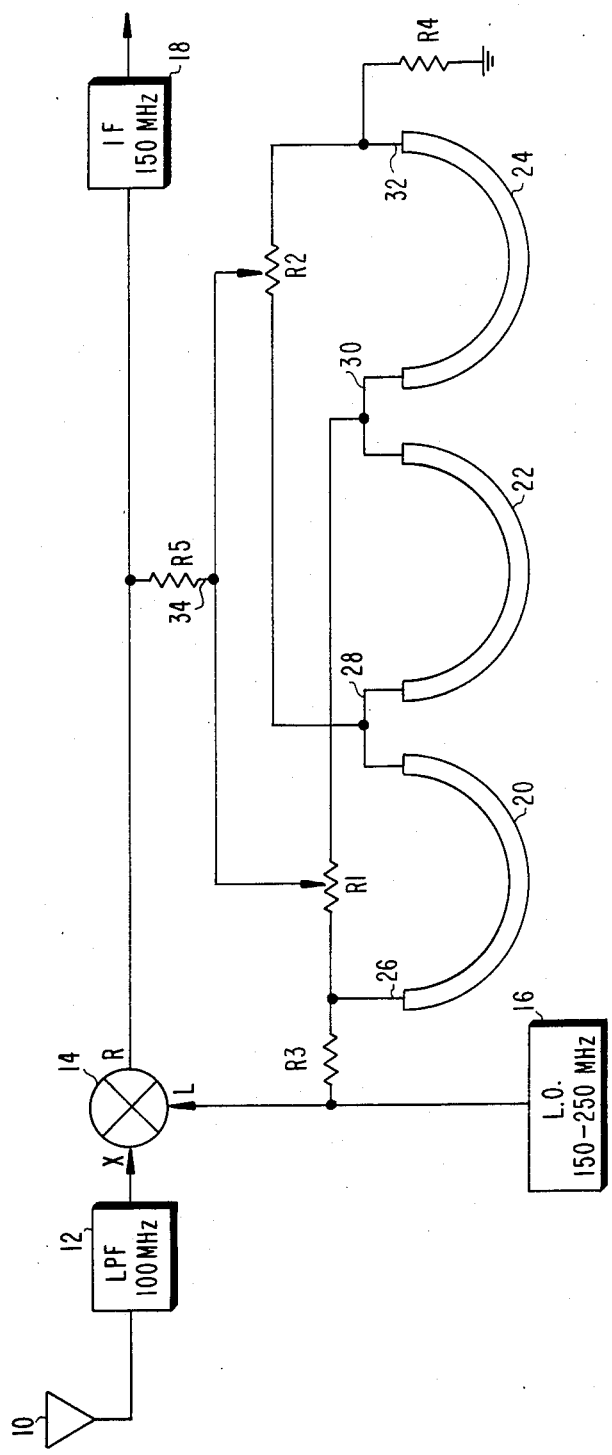
FIG. 1 is a drawing partly in schematic form and partly in block diagram form of a local oscillator null circuit according to the preferred embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to FIG. 1, a portion of a receiver with a local oscillator null circuit according to the present invention is shown partially in schematic form and partially in block diagram form. A number of circuits and electrical components shown in FIG. 1 are of a conventional form which is common to receivers and spectrum analyzers which tune close to zero frequency, namely, an antenna 10 connected to the input of low-pass filter (LPF) 12 which is in turn connected to the "X" input of mixer 14. Local oscillator (L.O.) 16 supplies the local oscillator signal to the "L" input of mixer 14, and the "R" output of the mixer is connected to IF stage 18. Mixer 14 is preferably a double-balanced mixer with 50-ohm output impedance, although other types of mixers and other impedance characteristics are also suitable. The mixer is connected as just described, with its "X" port connected to the RF input, because that port has a wider frequency response than the other two, and because it is desired that the receiver be tunable down to very low frequencies, preferably to DC. The other two ports are connected internally to RF transformers incapable of passing DC signals. LPF 12 has a corner frequency of 100 MHz whereby it passes RF signals received on antenna 10 in the frequency range 0-100 MHZ. L.O. 16 is tunable from 150-250 MHz, and IF stage 18 includes at least one amplifier and at least one bandpass filter tuned to pass the difference frequency component output of mixer 14. As shown, the receiver is configured for a first IF frequency of 150 MHz, although the IF frequency varies according to the design requirements for the receiver, as will be appreciated by those skilled in the art. The description herein suffices to explain the principles of the invention, which are equally applicable to systems operating at other frequencies, particularly including microwave frequencies. As one example, the invention has been employed in a spectrum analyzer with a frequency range from DC to approximately 2 GHz.

As stated previously, a problem which exists with receiver configurations such as that just described is that, when the local oscillator is tuned close to zero frequency, a signal at the L.O. frequency appears in the output spectrum of the mixer from which it may pass into the filters and amplifiers in the IF stage at a level high enough to cause the IF circuits to saturate with the unwanted signal. This problem may be eliminated or reduced by inclusion of a local oscillator null circuit between the "L" input of mixer 14 and the "R" output to cancel the feedthrough signal, as will now be described.

Figure 3:
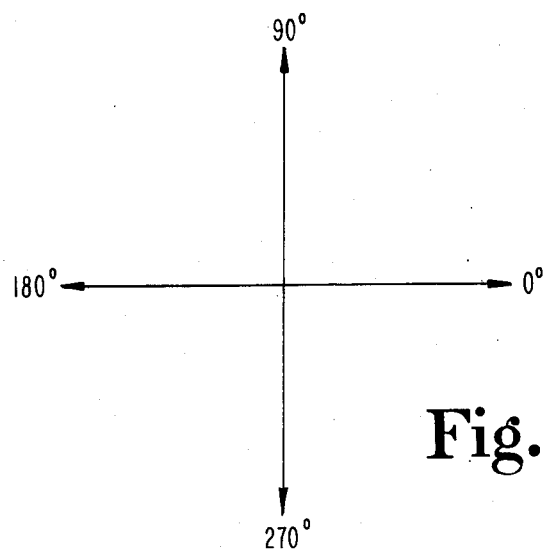
FIG. 3 is a phaser diagram of the four signals derived from the local oscillator signal in the preferred embodiment shown in FIG. 1.

In the preferred embodiment, shown in FIG. 1, the local oscillator null circuit is an all-phase circuit comprising potentiometers R1 and R2, resistors R3, R4, and R5, and phase-shift elements 20, 22, and 24. Each phase-shift element is a transmission line, preferably microstrip, having a characteristic impedance of 50 ohms and having a length of one-quarter wavelength at the IF frequency of 150 MHz. Alternatively, the phase-shift elements may be constructed of other types of transmission line, such as coaxial line or stripline, or may be any other device exhibiting the desired phase characteristic. As is well known, a quarter-wavelength transmission line exhibits a 90° phase-shift between its input and output. Thus, microstrip 20 produces 90° phase shift, and microstrips 22 and 24 each produce an additional 90° phase-shift, resulting in a set of four signals derived from the L.O. signal and varying in phase with respect therewith by increments of 90°. The L.O. output signal is fed through resistor R3 to microstrip 20. The signal on line 26, the input to microstrip 20, is in phase with the L.O. signal in the preferred embodiment, and the signals on lines 28, 30 and 32 lag that signal by 90°, 180°, and 270°, respectively, as shown in FIG. 3. For reference purposes, then, the signals on lines 26, 28, 30 and 32 are referred to herein as the 0°, 90°, 180°, and 270° signals, respectively.

The transmission line consisting of microstrips 20, 22 and 24 is terminated in resistor R4, which is 50 ohms to match the characteristic impedance of the transmission line. The local oscillator and mixer each have 50-ohm output impedance. The value of each potentiometer is 500 ohms, R3 is preferably 180 ohms, and R5 is preferably 270 ohms. It will be understood by those skilled in the art that a characteristic impedance of 50 ohms is not necessary for the circuit to perform and that, accordingly, the invention may alternatively be embodied in other than 50-ohm systems.

Potentiometer R1 is fed a 0° signal and a 180° signal from lines 26 and 30, respectively. Similarly, potentiometer R2 is fed a 90° signal and a 270° signal from signal lines 28 and 32, respectively. The 0° and 180° signals are summed in a proportion determined by the position of the wiper of R1, and the 90° and 270° signals are likewise summed in a proportion determined by the position of the wiper of R2. It will be understood that R1 has a null position in which its wiper is electrically centered between the two end positions. The two end positions correspond to the maximum amplitudes of the two signals of opposite phase which are applied to R1.

Similarly, R2 has a null position and two end positions which correspond to maximum amplitude signals with opposite phase. Thus, potentiometers R1 and R2 can be adjusted to produce, by phasor addition of the various phase-shifted outputs of L.O. 16, a current signal in R5 of desired amplitude and phase. That is, by adjusting R1 and R2, the all-phase circuit shown in FIG. 1 can be made to generate an output signal which varies from a null to a maximum available signal with phase adjustable from 0° to 360°. Since the preferred embodiment employs a summing network, the desired phase is of course opposite that of the signal at the L.O. frequency in the mixer output spectrum. The amplitude and phase of the signal at the L.O. frequency in the mixer output spectrum are measured or otherwise monitored for the purpose of adjusting the potentiometers. The derivative signal is proportional to the signal at the L.O. frequency in the mixer output spectrum such that, when the derivative signal on line 34 is summed with the composite mixer output signal through resistor R5, a null results at the L.O. frequency in the signal applied to IF amplifier 18. By providing a derivative signal at any phase, R1 and R2 provide a simple means for compensating for any phase shift introduced between the L.O. and the mixer output, such as phase shift in the mixer itself. With the construction shown, local oscillator feedthrough may be cancelled by an output signal from the all-phase circuit regardless of the phase shift between the L.O. and the mixer output.

Figure 6:
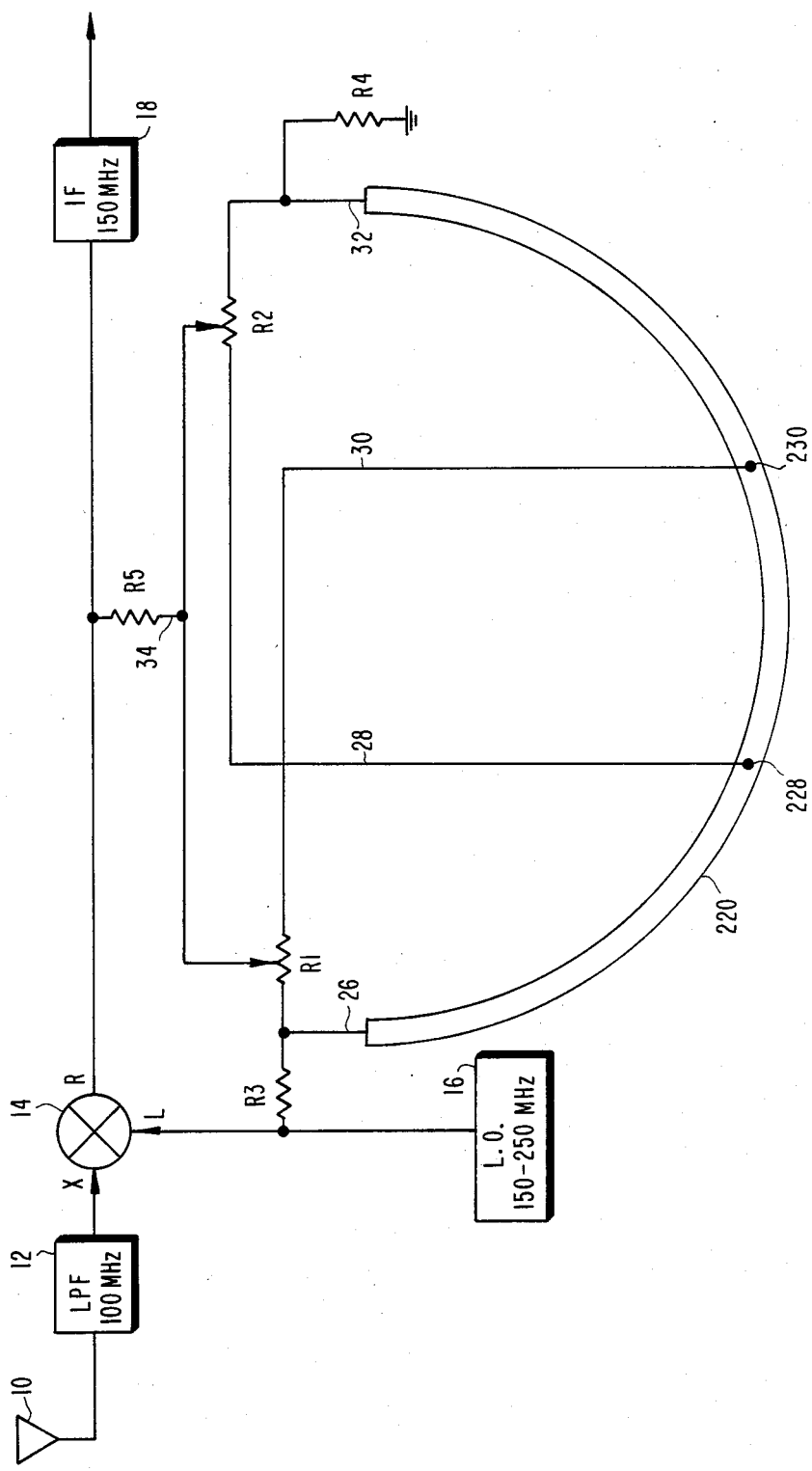
FIG. 6 is a drawing, partly in schematic form and partly in block diagram form, of a local oscillator null circuit according to yet another alternative embodiment of the present invention.

Those skilled in the art will appreciate from the foregoing that the transmission lines described may be alternatively configured as three separate quarter-wavelength microstrips or as one microstrip having a length of three-quarter wavelengths and having appropriate taps or terminals at quarter-wavelength intervals. An example of the latter configuratin is shown in FIG. 6, wherein taps 228 and 230 are provided at one and two quarter wavelengths, respectively, from the end of microstrip 220 connected to line 26. The local oscillator null circuit of FIG. 6 is otherwise identical to that shown in FIG. 1. Also, coaxial line or stripline may be substituted for every microstrip described herein. It will be further understood that phase-shift devices other than transmission line are suitable for use in a circuit such as that described, and that variable reactances may be employed in place of potentiometers.

The combined signal is filtered and amplified by IF stage 18. For the embodiment of FIG. 1, all-phase circuit operation is necessary only at an L.O. frequency relatively close to 150 MHz. When the local oscillator is tuned to a signal appreciably above 150 MHz, the feedthrough is out of the passband of tuned IF stage 18 and is accordingly adequately suppressed by the first filter in the IF stage.

Figure 2:
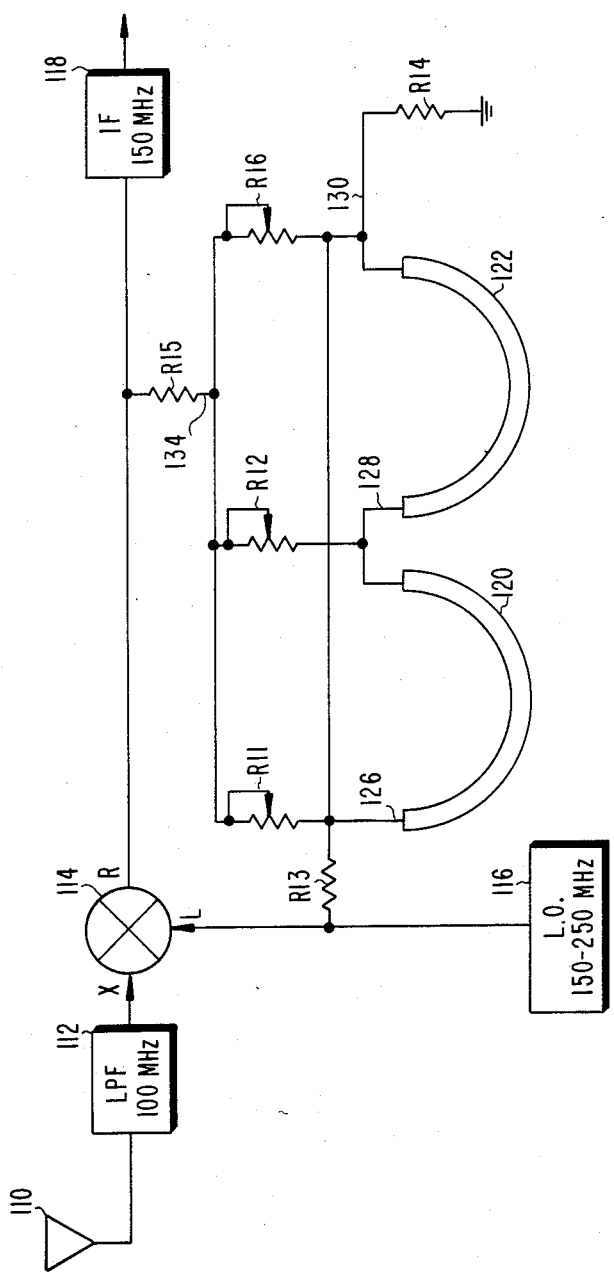
FIG. 2 is a drawing partly in schematic form and partly in block diagram form of a local oscillator null circuit according to an alternative embodiment of the present invention.
Figure 4:
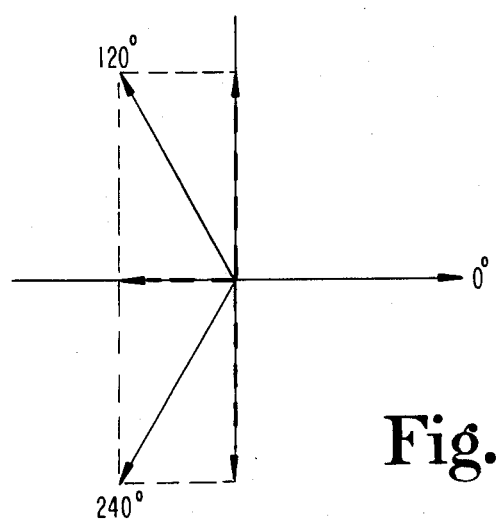
FIG. 4 is a phaser diagram with the three signals derived from the local oscillator signal in the alternative embodiment of FIG. 2.
Figure 5:
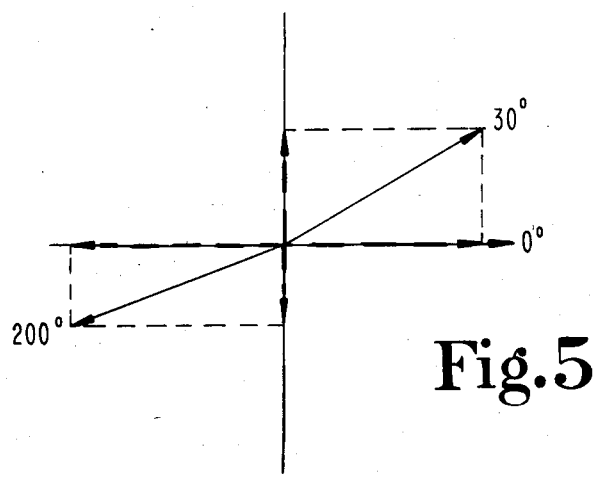
FIG. 5 is a phaser diagram of three signals derived from the local oscillator signal in yet another alternative embodiment of the present invention.

Although the all-phase circuit preferably generates four signals shifted in phase with respect to each other by integral multiples of 90°, with the 0° signal in phase with the L.O. signal, alternative circuits and phase relationships can be employed to generate the desired derivative signal. For example, the circuit can accommodate phase shift between the L.O. signal and the signal applied to microstrip 20, whether by design or due to stray capacitance. Moreover, it is not necessary to combine four signals separated in phase by 90° increments to generate a signal of any desired phase. For example, in one alternative embodiment, the all-phase circuit includes a three-phase source, with three signals differing in phase successively by 120°. This embodiment is shown in FIGS. 2 and 4 and described more fully below. Unequal phase differences are also possible, for example, three signals lagging the L.O. signal by 0°, 30°, and 200°, as shown in FIG. 5. In general, any desired phase can be generated by phasor addition of three signals having a phase relationship in which their phasor representations, when resolved into components in the complex plane, include a component on each of the four half-axes of the complex plane's rectangular coordinate system. The components of the signals in FIGS. 4 and 5 are indicated by dotted lines to indicate two examples of this phasor relationship.

In some mixers, such as dual-gate FET mixers, where the phase shift of the L.O. feedthrough is defined within relatively narrow limits, a simpler network may be used having limited phase variation plus necessary gain. For example, such a network could include an inverter (or transformer) connected to the local oscillator output, with the inverter output connected through a resistor to a reactance, such as an LC tank circuit, connected to ground. A series combination of a potentiometer and a second resistor connected from the reactance to the input of the IF stage controls the amplitude of the network output signal.

FIG. 2 illustrates an alternative embodiment of a local oscillator null circuit according to the present invention in which three signals are generated in the all-phase circuit. An antenna 110 is connected to the input of low-pass filter (LPF) 112 which is in turn connected to the "X" input of mixer 114. Mixer 114 has its "L" input connected to local oscillator (L.O.) 116 and its "R" output connected to IF stage 118. As with the embodiment shown in FIG. 1, the receiver is configured for a first IF frequency of 150 MHz, and LPF 112 has a corner frequency of 100 MHz whereby it passes RF signals received on antenna 110 in the frequency range 0–100 MHZ. L.O. 116 is tunable from 150–250 MHz, and IF stage 118 includes at least one amplifier and at least one bandpass filter tuned to pass the difference frequency component output of mixer 114.

The all-phase circuit comprises potentiometers R11, R12, and R16, resistors R13, R14, and R15, and phase-shift elements 120 and 122. Each phase-shift element is a transmission line, preferably microstrip, having a characteristic impedance of 50 ohms and having a length of one-third wavelength at the IF frequency of 150 MHz whereby each transmission line exhibits a 120° phase-shift between its input and output. Thus, microstrip 120 produces 120° phase shift, and microstrip 122 produces an additional 120° phase-shift, resulting in a set of three signals derived from the L.O. signal and varying in phase with respect thereto by increments of 120° as shown in FIG. 4. The signal on line 126, the input to microstrip 120, is preferably in phase with the L.O. signal, and the signals on lines 128 and 130 lag that signal by 120° and 240°, respectively. Microstrip 122 is terminated in resistor R14, which is 50 ohms to match the characteristic impedance of the transmission line. The various potentiometer, resistor and output impedance values are preferably the same as described above with reference to the embodiment of FIG. 1.

Potentiometer R11 is fed a 0° signal from signal line 126, potentiometer R12 is fed a 120° signal from line 128, and potentiometer R16 is fed a 240° signal from line 130. The three signals from the transmission line are summed in proportions determined by the positions of the wipers of R11, R12, and R16. It will be understood that the maximum amplitude output from each potentiometer is obtained when the potentiometer wiper is positioned to short out the potentiometer. Thus, the three potentiometers can be adjusted to produce, by phasor addition of the various phase-shifted outputs of L.O. 116, a current signal in R15 of desired amplitude and phase varying from a null to a maximum available signal with phase adjustable from 0° to 360°. The derivative signal on line 134 is proportional to the signal at the L.O. frequency in the mixer output spectrum such that, when the derivative signal is summed with the composite mixer output signal through resistor R15, a null results at the L.O. frequency in the signal applied to the IF stage.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

I claim:

1. A local oscillator null circuit for a heterodyne receiver in which a mixer supplied with an RF input signal and a corresponding signal from a local oscillator produces an output spectrum which includes the local oscillator frequency in addition to the frequency of an associated tuned IF stage, said circuit comprising:
   (a) a first microstrip having length of one-quarter wavelength, said first microstrip having first and second ends, said first end being connected to said local oscillator;
   (b) a second microstrip having length of one-quarter wavelength, said second microstrip having first and second ends, said first end of said second microstrip being connected to said second end of said first microstrip;
   (c) a third microstrip having length of one-quarter wavelength, said third microstrip having first and second ends, said first end of said third microstrip being connected to said second end of said second microstrip;
   (d) a first potentiometer having one end lead connected to said first end of said first microstrip, another end lead connected to said second end of said second microstrip, and a wiper;
   (e) a second potentiometer having one end lead connected to said first end of said second microstrip and another end lead connected to said second end of said third microstrip, and a wiper connected to said wiper of said first potentiometer; and
   (f) a summing resistor connected between the wipers of said potentiometers and the output of said mixer.

2. A local oscillator null circuit for a heterodyne receiver in which a mixer supplied with an RF input signal and a corresponding signal from a local oscillator produces an output spectrum which includes the local oscillator frequency in addition to the frequency of an associated tuned IF stage, said circuit comprising:
   (a) circuit means connected to said local oscillator for generating a derivative signal proportional to said local oscillator signal and shifted in phase with respect thereto by a desired amount determined by the phase difference between said local oscillator signal and the signal in said mixer output spectrum which is at said local oscillator frequency, said circuit means including
      (1) means for generating at least three signals each having a phasor representation resolvable into components with respect to a rectangular coordinate system, said components including a component on each of the four half-axes of the coordinate system; and
      (2) means for combining said components in a desired proportion; and
   (b) means for combining said derivative signal with the mixer output signal proportionally to produce a null at said local oscillator frequency, said combining means being connected between said mixer and said IF stage.

3. The local oscillator null circuit of claim 2 wherein said means for generating at least three signals includes
   (A) means for generating four signals shifted in phase with respect to each other by integral multiples of 90°, whereby said four signals include first and second pairs of signals of opposite phase;
and wherein said means for combining components includes
   (A) means for summing the signals in said first paid of signals in a first proportion and summing the signals in said second pair of signals in a second proportion; and
   (B) means for combining said summed signals.

4. The local oscillator null circuit of claim 3 wherein said means for generating four signals includes first, second, and third series-connected transmission lines having length of one-quarter wavelength at the IF frequency, said first transmission line being connected at one end to said local oscillator and at the opposite end to said second transmission line, whereby said three transmission lines cooperate to produce signals of 90°, 180°, and 270° phase shift with respect to a signal on said one end of said first transmission line.

5. The local oscillator null circuit of claim 4 wherein said summing means includes first and second potentiometers each having two end leads and an associated wiper, said first potentiometer having one end lead connected to said one end of said first transmission line and the other end lead connected to the junction of said second and third transmission lines, said second potentiometer having one end lead connected to the junction of said first and second transmission lines and the other end lead connected to the end of said third transmission line opposite said junction of said second and third transmission lines, said wipers being directly interconnected.

6. The local oscillator null circuit of claim 5 wherein said three transmission lines are microstrips.

7. The local oscillator null circuit of claim 5 wherein said three transmission lines are coaxial lines.

8. The local oscillator null circuit of claim 3 wherein said means for generating four signals includes a transmission line three quarter-wavelengths long, said transmission line having an input connected to said local oscillator and having three output terminals spaced at quarter-wavelength intervals along said transmission line, whereby said transmission line produces signals at said output terminals of 90°, 180°, and 270° phase shift with respect to a signal on said transmission line input.

9. The local oscillator null circuit of claim 8 wherein said summing means includes first and second potentiometers each having two end leads and an associated wiper, said first potentiometer having one end lead connected to said transmission line input and the other end lead connected to the output terminal spaced one quarter-wavelength from said transmission line input, said second potentiometer having one end lead connected to the output terminal spaced two quarter-wavelengths from said transmission line input and the other end lead connected to the output terminal spaced three quarter-wavelengths from said transmission line input, said wipers being directly interconnected.

10. The local oscillator null circuit of claim 9 wherein said transmission line is microstrip.

11. The local oscillator null circuit of claim 9 wherein said transmission line is a coaxial line.

12. The local oscillator null circuit of claim 2 wherein said means for generating at least three signals includes first and second series-connected transmission lines having length of one-third wavelength at the IF frequency, said first transmission line being connected at one end to said local oscillator and at the opposite end to said second transmission line, whereby said transmission lines cooperate to produce signals of 120° and 240° phase shift with respect to a signal on said one end of said first transmission line.

13. The local oscillator null circuit of claim 12 wherein said means for combining components includes first, second, and third potentiometers each having an end lead and a wiper, said first potentiometer having its end lead connected to said one end of said first transmission line, said second potentiometer having its end lead connected to the junction of said first and second transmission lines, said third potentiometer having its end lead connected to the end of said second transmission line opposite said junction of said first and second transmission lines, said wipers being directly interconnected.

14. A method of reducing the effect of feedthrough from a local oscillator to an associated IF stage in a heterodyne receiver, said receiver having a mixer responsive to an RF input signal and a corresponding signal from said local oscillator to produce an output spectrum which includes the local oscillator frequency in addition to the IF frequency, said method comprising:
summing the mixer output signal with a signal derived from said local oscillator signal and having substantially the same amplitude as and opposite phase of the signal at said local oscillator frequency in said mixer output spectrum,
wherein said derived signal is derived by generating at least three signals each having a phasor representation resolvable into components with respect to a rectangular coordinate system, said components including a component on each of the four half-axes of the coordinate system; and combining said components in a desired proportion.

15. The method of claim 14 wherein said derived signal is derived by generating four signals shifted in phase with respect to each other by integral multiples of 90°, whereby said four signals include first and second pairs of signals of opposite phase; summing the signals in said first pair of signals in a first proportion and summing the signals in said second pair of signals in a second proportion; and combining said summed signals.

16. A method of tuning relatively close to zero frequency with a wideband, heterodyne receiver having a mixer which, when supplied at one input with an RF input signal and at another input with a signal of corresponding frequency generated by a local oscillator, produces an output signal having a spectrum which includes the local oscillator frequency in addition to a desired IF frequency, said method comprising the steps:
(a) tuning said local oscillator to a frequency corresponding to said RF input signal;
(b) mixing said local oscillator signal and said RF input signal in said mixer;
(c) deriving a signal from said local oscillator signal which is opposite in phase to the signal in said mixer output spectrum which is at said local oscillator frequency, said deriving step including generating at least three signals each having a phasor representation resolvable into components with respect to a rectangular coordinate system, said components including a component on each of the four half-axes of the coordinate system; and combining said components in a desired proportion; and
(d) summing the derivative signal and said mixer output signal in a proportion such that the derivative signal cancels the signal in said mixer output spectrum which is at said local oscillator frequency.

17. The method of claim 16 wherein said deriving step includes generating four signals shifted in phase with respect to each other by integral multiples of 90°, whereby said four signals include first and second pairs of signals of opposite phase; summing the signals in said first pair of signals in a first proportion and summing the signals in said second pair of signals in a second proportion; and combining said summed signals

* * * * *